United States Patent

Ershov

[11] Patent Number: 5,856,991
[45] Date of Patent: Jan. 5, 1999

[54] VERY NARROW BAND LASER

[75] Inventor: Alexander I. Ershov, San Diego, Calif.

[73] Assignee: Cymer, Inc., San Diego, Calif.

[21] Appl. No.: 869,239

[22] Filed: Jun. 4, 1997

[51] Int. Cl.$^6$ ...................................................... H01S 3/22
[52] U.S. Cl. .............................. 372/57; 372/102; 372/19; 372/20
[58] Field of Search .................................. 372/57, 20, 9, 372/19, 102

[56] References Cited

U.S. PATENT DOCUMENTS

| | | |
|---|---|---|
| 4,803,696 | 2/1989 | Pepper et al. . |
| 5,012,483 | 4/1991 | Reintjes et al. . |
| 5,043,998 | 8/1991 | Cooper et al. . |
| 5,095,492 | 3/1992 | Sandstrom . |
| 5,150,370 | 9/1992 | Furuya et al. . |
| 5,327,449 | 7/1994 | Du et al. . |
| 5,559,816 | 9/1996 | Basting et al. ............................ 372/27 |

*Primary Examiner*—Leon Scott, Jr.
*Attorney, Agent, or Firm*—John R. Ross, Esq.

[57] ABSTRACT

A very narrow band excimer laser. The very narrow bandwidth is achieved by using an etalon as an output coupler in combination with a line narrowing element located at the rear of the laser. Preferred embodiments are capable of producing 10 mJ laser pulses at 1000 Hz with a 95% integral bandwidth of less than 1.5 pm.

15 Claims, 11 Drawing Sheets

VERY NARROW BAND LASER

This invention relates to lasers and in particular to narrow band KrF lasers.

BACKGROUND OF THE INVENTION

KrF excimer lasers are currently becoming the workhorse light source for the integrated circuit lithography industry. A typical prior art KrF excimer laser is depicted in FIG. 1 and FIG. 2. A pulse power module 2 provides electrical pulses lasting about 100 ns to electrodes 6 located in a discharge chamber 8. The electrodes are about 28 inches long and are spaced apart about ⅗ inch. Typical lithography lasers operate at a high pulse rate of about 1,000 Hz. For this reason it is necessary to circulate a laser gas (a typical example being about 0.1 percent fluorine, 1.3 percent krypton and the rest neon which functions as a buffer gas) through the space between the electrodes. This is done with tangential blower 10 located in the laser discharge chamber. The laser gasses are cooled with a heat exchanger also located in the chamber. Commercial excimer laser systems are typically comprised of several modules which may be replaced quickly without disturbing the rest of the system. Principal modules are shown in FIG. 1 and include:

Laser Chamber 8,

Pulse Power Module 2,

Output coupler 16,

Line Narrowing Module 18,

Wavemeter 20,

Computer Control Unit 22, and

Peripheral Support Sub systems.

The discharge chamber is operated at a pressure of about three atmospheres. These prior art lasers typically operate in a pulse mode at about 600 Hz to about 1,000 Hz, the energy per pulse being about 10 mJ and the duration of the laser pulses is about 15 ns. Thus, the average power of the laser beam is about 6 to 10 Watts and the average power of the pulses is in the range of about 700 KW.

At wavelengths below 300 nm there is no available technique for providing refractive systems with chromatic correction. Therefore, stepper lenses will have no chromatic correction capability. The KrF excimer laser operates at a nominal wavelength of about 248 nm and has a natural bandwidth of approximately 300 pm (full width half maximum, or FWHM). For a refractive system (with a numerical aperture >0.5)—either a stepper or a scanner—the wavelength of the light source needs to be held substantially constant with variations and spread minimized to the picometer range. Current prior art commercially available laser systems can provide KrF laser beams at a nominal wave length of about 248 nm with a bandwidth of about 0.8 pm (0.0008 nm). Wavelength stability on the best commercial lasers is about 0.25 pm. With these parameters stepper makers can provide stepper equipment to provide integrated circuit resolutions of about 0.3 microns.

To improve resolution a more narrow bandwidth is required. For example, a reduction of a bandwidth to below 0.6 pm (FWHM) would permit improvement of the resolution to below 0.25 microns. As indicated above, the bandwidth is usually specified as the pulse width measured (on a chart of pulse power versus wavelength) as the full width at one half the maximum power of the pulse. Another important measure of the pulse quality is referred to as the "95% integral." This is the spectral width of the portion of the pulse containing 95% of the pulse energy. The desired 95% bandwidth is less than about 1.5 pm to 2.0 pm. However, the prior art KrF laser can only provide "95% integral" values of 3 pm over the lifetime of the laser.

It is known to use etalons in excimer lasers for wavelength control, either alone or in combination with gratings and/or prisms. The main disadvantage of etalons in a high power laser is that heat produced by the laser beam can distort the etalon changing the optical parameters of the etalon. This problem has been recognized and dealt with in at least two patents: U.S. Pat. No. 5,150,370 issued on Sep. 22, 1992 to Furuya et al. and U.S. Pat. No. 5,559,816 issued on Sep. 24, 1996 to Basting and Kleinchmidt. Both of these arrange for a laser as two polarization-coupled cavities with the main light generation taking place in the first cavity and the wavelength control being done by the etalon placed in relatively low-power second cavity. This technique, even though improving optical performance of the etalon, still is not able to reduce "95% integral" to required 1.5–2.0 pm; and also, this technique is quite complicated.

The performance of stepper equipment depends critically on maintaining minimum bandwidth of the laser throughout the operational lifetime of the equipment. Therefore, a need exist for a reliable, production quality excimer laser system, capable of long-term factory operation and having wavelength stability of less than 0.2 pm and a FWHM bandwidth of less than 0.5 pm and a 95% integral bandwidth of less than 2.0 pm.

SUMMARY OF THE INVENTION

The present invention provides a very narrow band excimer laser. The very narrow bandwidth is achieved by using an etalon as an output coupler in combination with a line narrowing unit located at the rear of the laser. In a preferred embodiment, the wavelength of a reflection maximum of the etalon matches the wavelength maximum produced by the line narrowing unit. In this preferred embodiment, a line narrowing module utilizes a prism beam expander and a diffraction grating. Both the output coupler and the line narrowing module are tunable and are computer controlled based on real time wave meter measurements of the laser output beam wavelength. Additional reductions may be obtained by reducing the fluorine partial pressure to less than 0.08%. Preferred embodiments are capable of producing 10 mJ laser pulses at 1000 Hz having spectral stability of less than 0.2 pm with a bandwidth of less than 0.5 pm (FWHM) and 1.5 pm (95% integral).

DETAILED DESCRIPTION OF PREFERRED EMBODIMENTS

Very Narrow-Band KrF Laser

A very narrow-band KrF laser utilizing the features of the present invention is described below:

The Chamber

Figure 1:
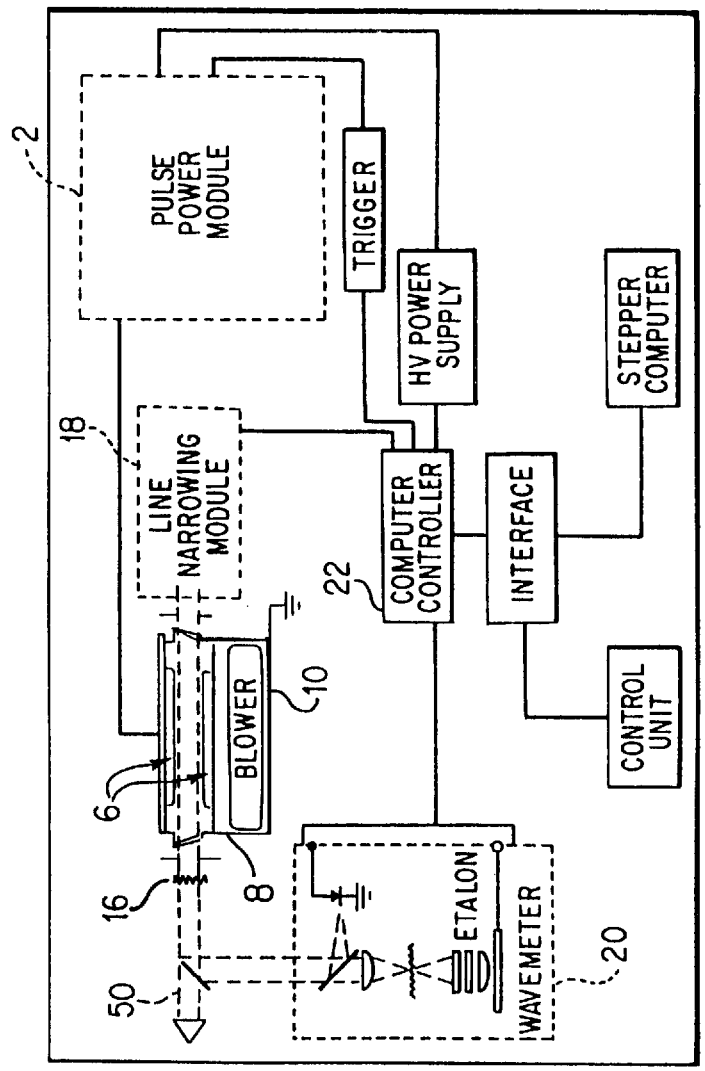
FIG. 1 is a block drawing showing the principal elements of a prior art commercial KrF excimer lasers used for integrated circuit lithography.
Figure 2:
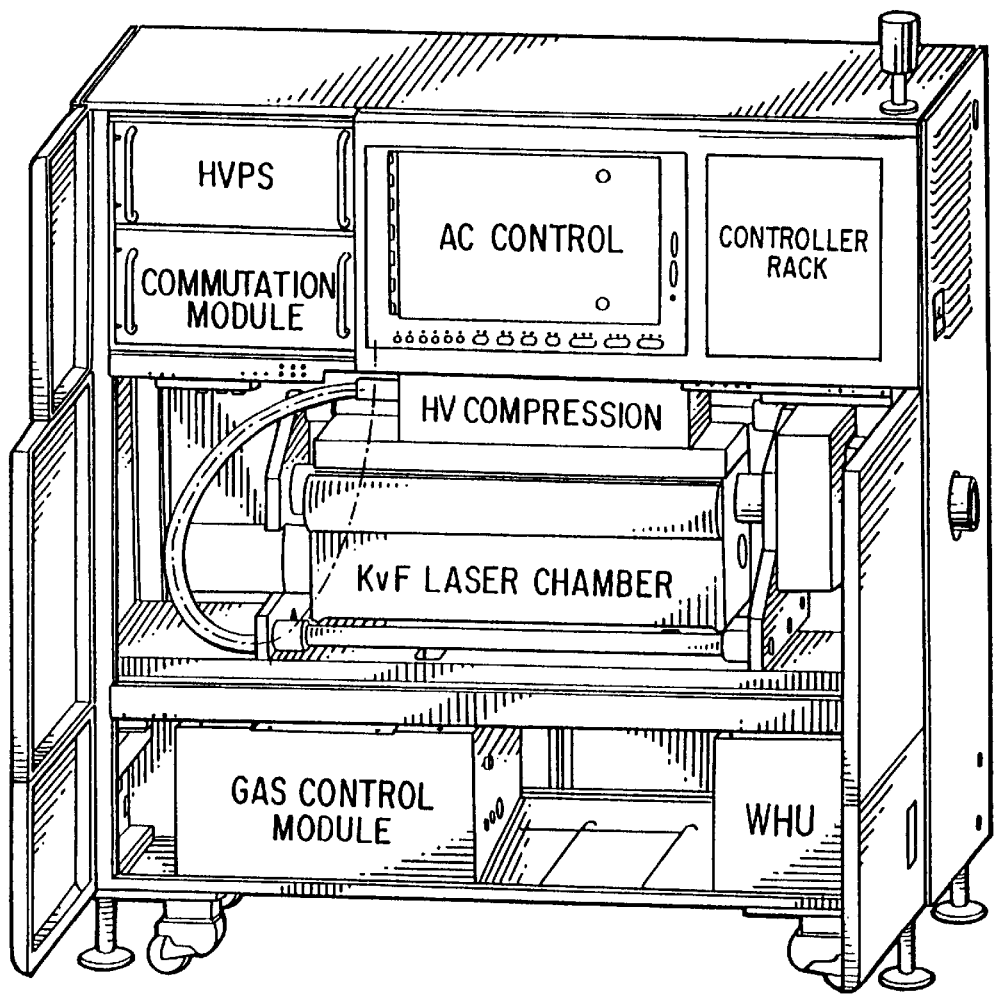
FIG. 2 is a schematic drawing of the above prior art KrF laser.
Figure 3:
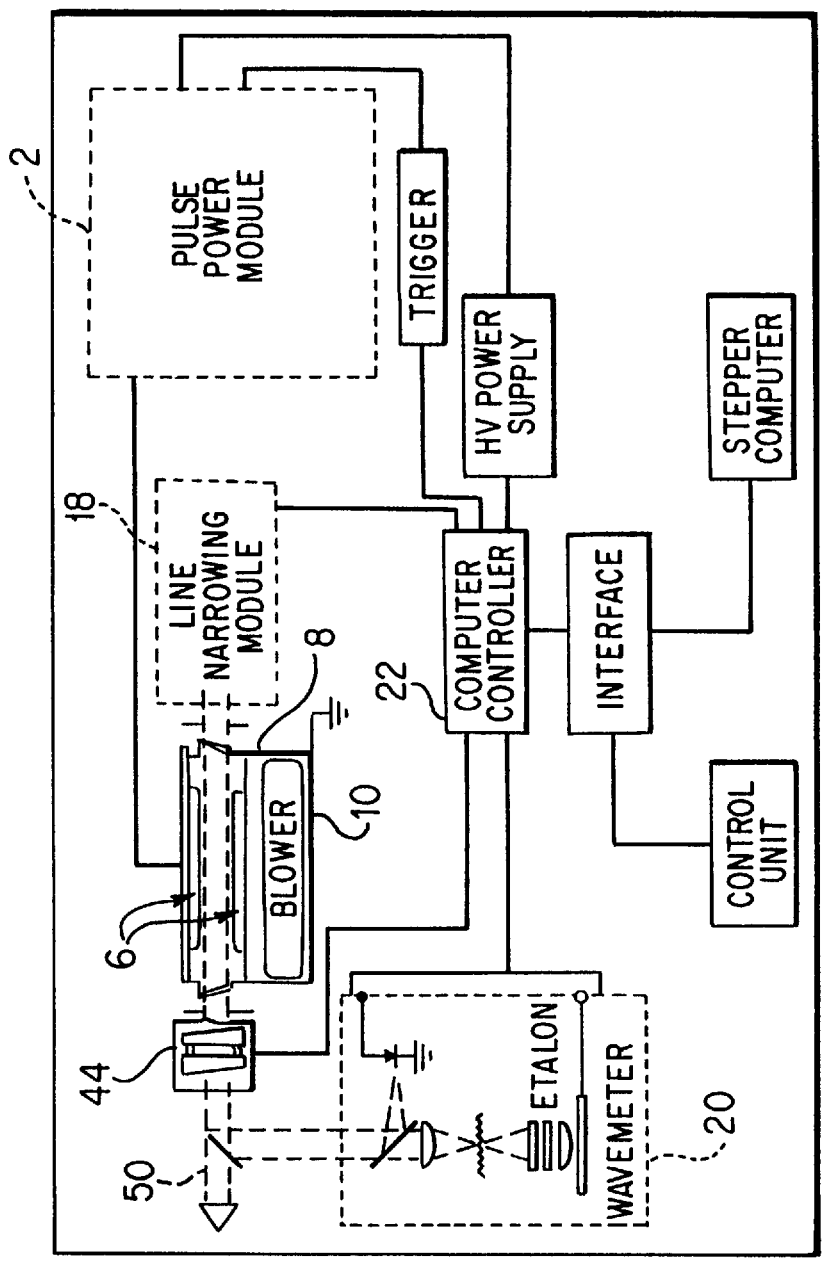
FIG. 3 is a block diagram showing the present invention.

The discharge chamber 8 of a preferred embodiment of the present invention, shown in FIG. 3, is the same as prior art discharge chambers. The chamber 8 is a vessel, designed to hold several atmospheres of corrosive gases. A discharge region is defined by the two electrodes 6 separated by a gap of 1.2 to 2.5 cm. The cathode is supported by an insulating structure since it is connected to the high voltage, while the anode is attached to the metal chamber which is at ground potential. Preionization is done by corona discharge preionizers located on either side of the discharge region. Due to the corrosive nature of the laser gas, the chambers use particular metals chosen to resist fluorine attack. The fluorine gas however, still reacts with the chamber internal parts such as chamber walls and electrodes; thus consuming fluorine and generating metal fluoride contaminants. Metal fluoride dust is trapped by means of an electrostatic precipitator not shown. A small amount of laser gas is extracted from the chamber and is passed over negatively charged high field wires to trap the dust. The dust-free gas is then released over the windows to keep them clean.

Pulse Power Module

Figure 4:
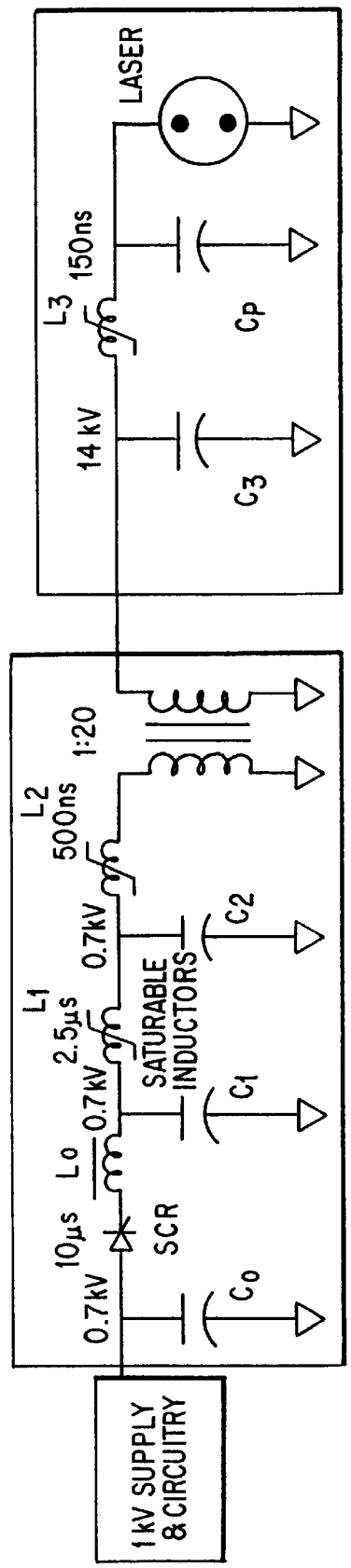
FIG. 4 is a simplified electrical drawing of a solid state pulse power circuit.
Figure 5:
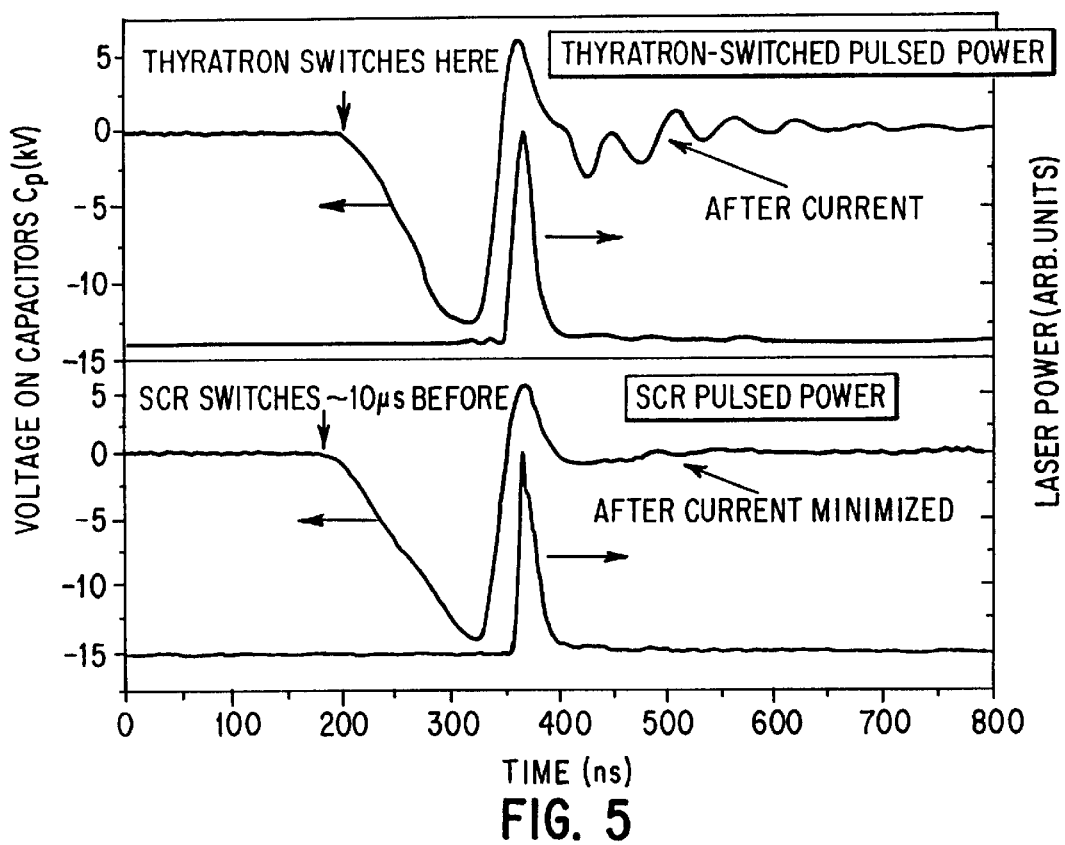
FIG. 5 are graphs comparing the results of a solid state pulse power circuit to a prior art thyratron-based circuit.
Figure 6:
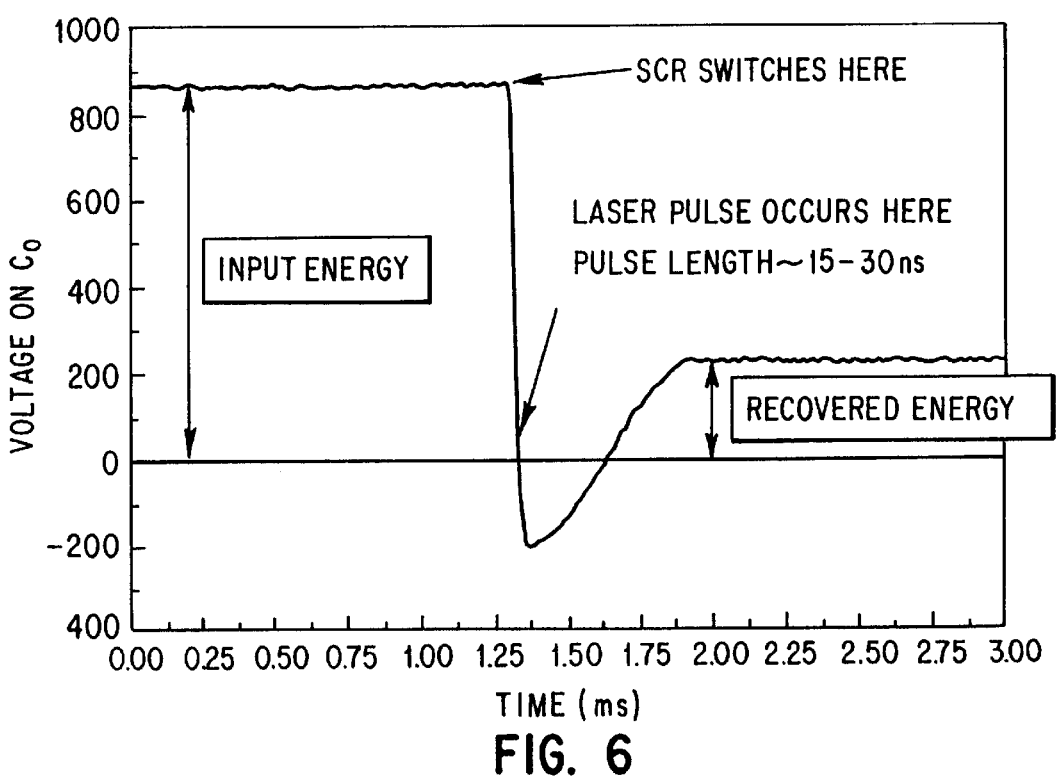
FIG. 6 is a graph of operating voltage during a pulse.

This preferred embodiment utilizes a solid state pulsed power module (SSPPM) circuit shown in FIG. 4. The 20 kV power supply of prior art thyratron systems is replaced by a 1 kV supply. The thyratron switch is replaced by an SCR switch that does not feed $C_p$ directly, but instead switches the energy of $C_0$ into a pulse compression circuit formed by $C_1$, $C_2$, $C_3$, a step-up transformer, and three saturable inductors. The operation of this circuit is as follows. The DC charge stored on $C_0$ is switched through the SCR and the inductor $L_0$ into $C_1$. The saturable inductor, $L_1$, holds off the voltage on $C_1$ for approximately 2.5 $\mu$s and then becomes conducting, allowing the transfer of charge from $C_1$ to $C_2$. The second saturable inductor, $L_2$, holds off the voltage on $C_2$ for approximately 500 ns and then allows the charge on $C_2$ to flow through the primary of 1:20 step-up transformer. The output from the step-up transformer is stored on $C_3$ until the saturable inductor $L_3$ becomes conducting in approximately 100–150 ns. The charge is then finally transferred through $L_3$ into $C_p$ and laser discharge occurs. The voltage waveform on $C_p$, shown at the bottom of FIG. 5 closely matches the shape of that produced by an equivalent thyrtaron-switched pulsed power module, except that the SRC waveform exhibits little or no after-ringing. The increased complexity of the SSPPM is compensated for by the elimination of the expensive and short-lived thyratron. The improvement in pulse control is shown in FIG. 5. An additional and important feature of the SSPPM is the recovery of the energy reflected from the laser chamber as shown in FIG. 6. With the SSPPM, the energy reflected by the laser chamber due to impedance mismatch no longer rings back and forth between the SSPPM and the laser chamber. The SSPPM circuit is designed to transmit this reflected energy all the way back through the pulse forming network into $C_0$. Upon recovery of this energy onto $C_0$, the SCR switches off ensuring that this captured energy remains on $C_0$. Thus, regardless of the operating voltage, gas mixture, or chamber conditions, the voltage waveform across the laser electrodes exhibits the behavior of a well-tuned system. This performance is maintained over all laser operating conditions.

Spectral Narrowing

Spectral narrowing of a KrF laser is complicated by its short pulse duration (10 to 15 ns, FWM and UV wavelength. The short pulse results in very high intracavity power (~1 MW/cm$^2$), and the short wavelength can thermally distort optical materials due to their high absorption co-efficient at 248 nm. Also, the total number of round trips through the resonator (which includes the line narrowing optical elements) for a typical laser is small, about 3 to 4. If the single pass line width through the resonator is denoted by $\Delta\lambda_1$, then an estimate of the final line width $\Delta\lambda_f$ after n passes is given by:

$$\Delta\lambda_f = \frac{\Delta\lambda_1}{\sqrt{n}} \tag{1}$$

Therefore, the single pass line width of the optical system is, at most, a factor of two higher than the final line width. Therefore, the efficiency of converting the broadband spectrum to line narrowed spectrum (i.e. from 300 pm to <1 pm) of the optical system must be very high.

Figure 7:
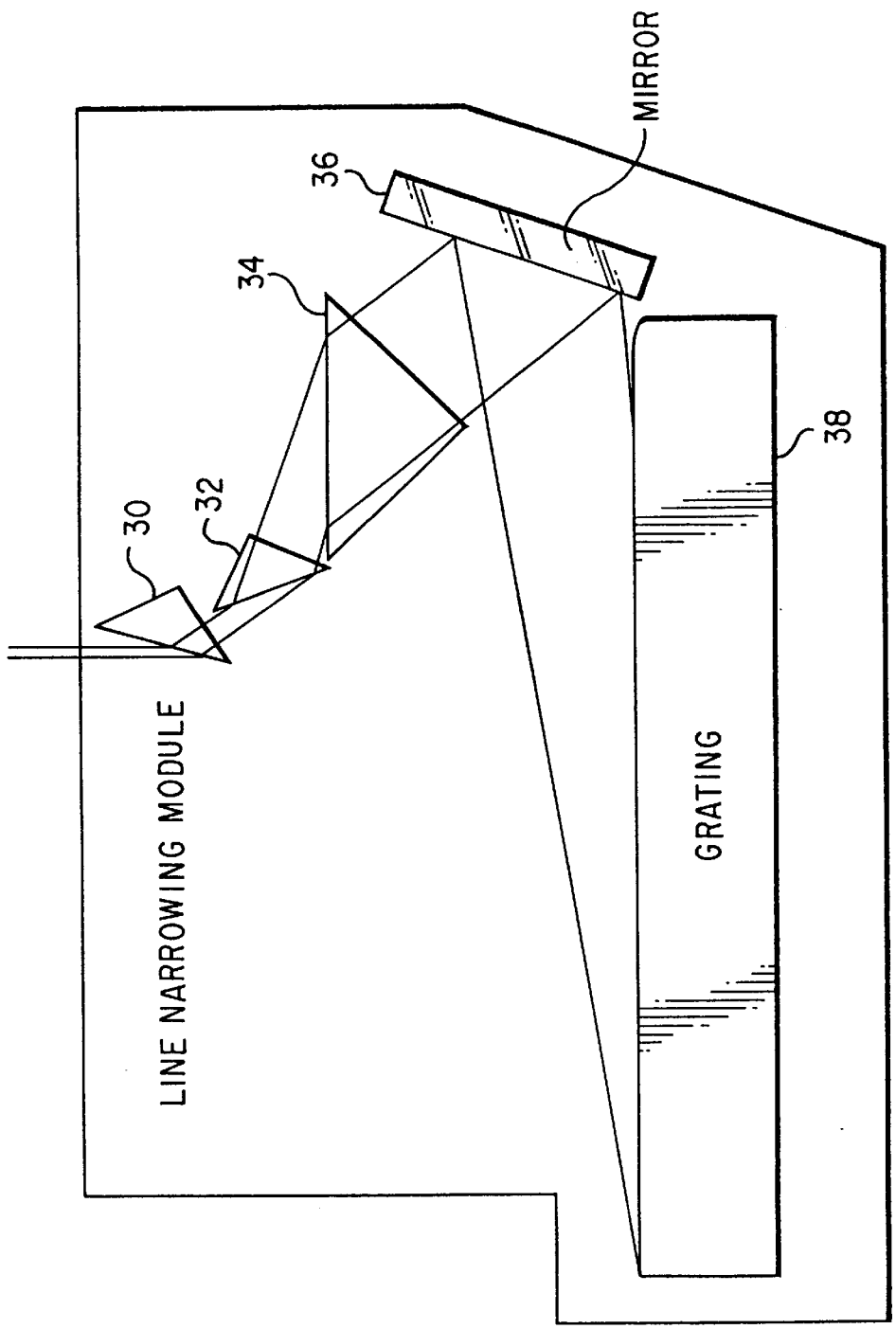
FIG. 7 is a sketch of the principal elements of a line narrowing module.

The common technique of line-narrowing the KrF laser is by introducing wavelength dispersive optical elements in the resonator. Three types of dispersive elements can be used: prisms, etalons and gratings. The use of a high dispersive grating in a Littrow configuration is the most effective spectral line narrowing technique. Because the grating is a dispersive element, to get a narrow line-width, the laser beam should have a small divergence where the beam illuminates the grating. Three prisms beam expanders 30, 32 and 34 as shown in FIG. 7 are inserted in the line narrowing module in order to expand the beam and thus reduce its divergence. Two apertures at both ends of the laser are used to further reduce divergence.

The principal elements of a preferred line narrowing module are shown in FIG. 7. These include three prisms 30, 32 and 34, a tuning mirror 36, and an eschelle grating 38. The mirror is pivoted to change the wavelength of the laser. This prior art line narrowing module 18 used in conjunction with the discharge chamber described and a prior art output coupler comprising a 10% partially reflecting mirror reduces the line width of KrF lasers to 0.8 pm (FWHM) and 3.0 pm (FWHM).

Tunable Etalon as Output Coupler

This preferred embodiment of the present invention further reduces the bandwidth by replacing the prior art output coupler with a tunable etalon unit 44 as shown is FIG. 3.

A tunable etalon is an etalon, the free spectral range (FSR) of which can be adjusted.

FSR is determined by:

$$FSR = \frac{\lambda^2}{2nd} \tag{2}$$

where:

n=refractive index of the gas in the gap d=size of the gap, and

λ=wavelength.

Commercially available tunable etalons consist of two parallel plates with an air space between them. The FSR can be changed by either changing the size of air space gap, or changing the gas pressure in the gap, and thus changing refractive index n in formula (2). Preferably, the tunable etalon, used as the output coupler would be tunable electronically and very rapidly. As indicated in FIG. 3, in this preferred embodiment, the etalon 44 used as the output coupler is controlled by computer controller 22 based on real time pulse output wavelength measurement signals from wavemeter 20. The computer controller 22 also controls the tuning of line narrowing module 18. U.S. Pat. No. 4,977,563 describes a tunable etalon. In this etalon, space between the plates is sealed and the distance between the plates is adjusted by increasing or decreasing the pressure on the outside of both plates. The teachings of U.S. Pat. No. 4,977,563 are incorporated herein by reference. Tunable etalons, in which the cavity spacing is controlled using piezoelectric transducers, are also commercially available. One supplier of such transducers is Burleigh Instruments, Inc., with offices in Fishers, N.Y. Various tunable etalons are also available from Milles Griot with offices in Irvine, Calif.

Figure 9:
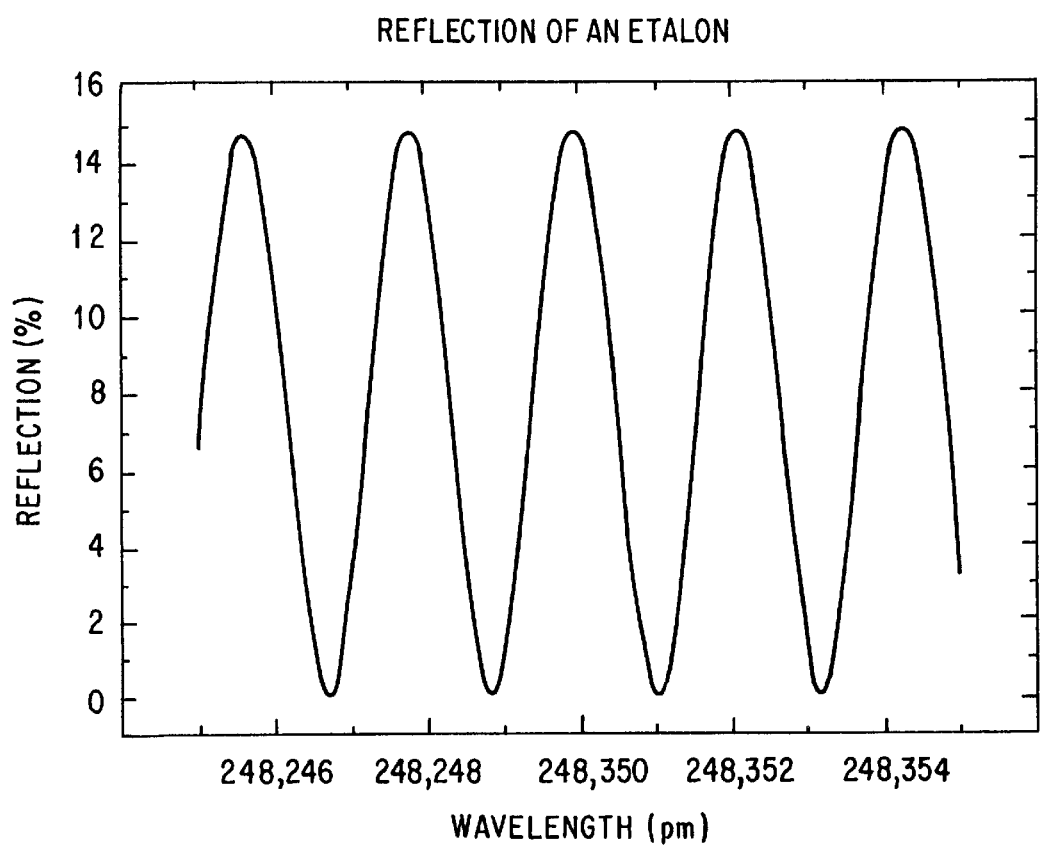
FIG. 9 is a drawing demonstrating etalon reflections.
Figure 14:
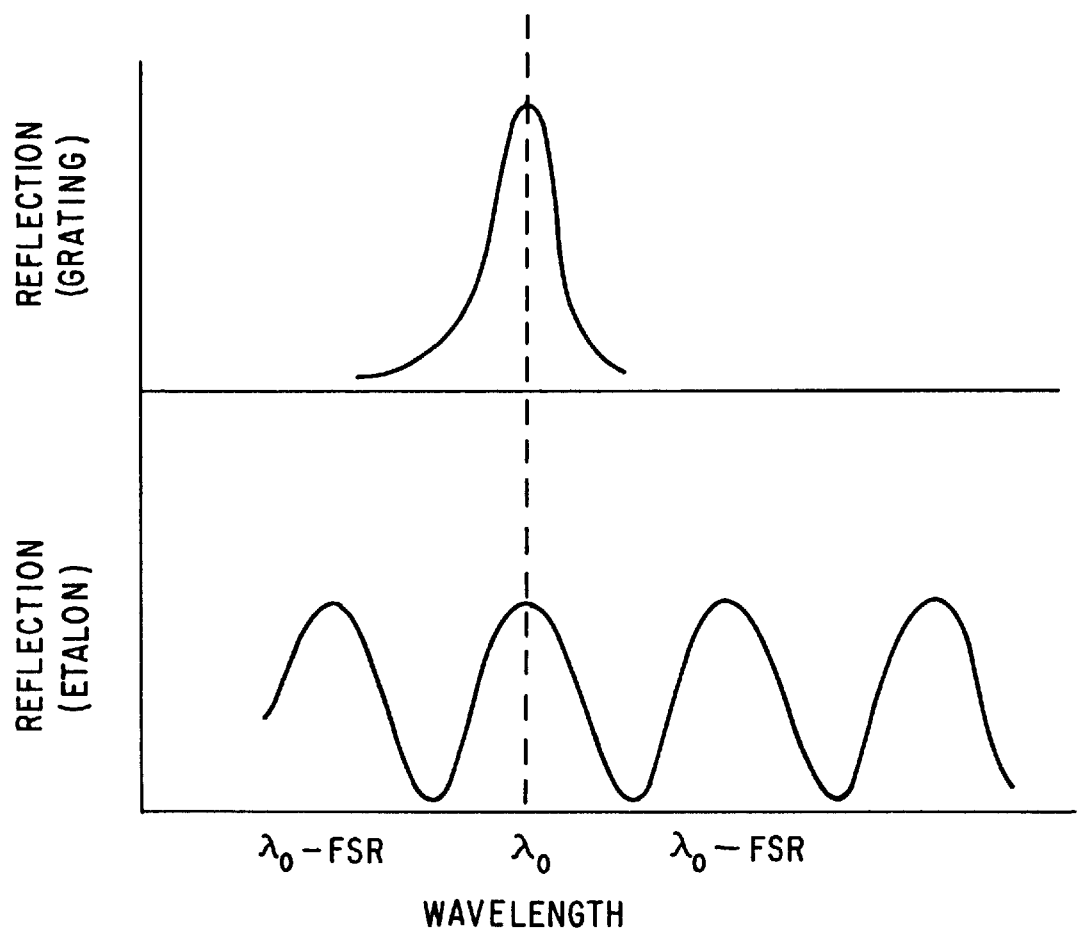
FIG. 14 compares reflections of a grating with an etalon.

The preferred tunable etalon is a reflective etalon designed to reflect about 0% to about 15% of incoming light depending on the wavelength of the light and to transmit substantially all of the remaining light as indicated in FIG. 9. The etalon in this application is used in what is referred to as a "reflective mode." Surfaces are designed for a reflection of about 4%. In typical etalons used in prior art lasers for wavelength control, reflecting surfaces reflect about 70% of the light. These etalons are used in a "transmissive mode." In the transmissive mode, multiple (about 5 to 10) reflections per photon occur within the etalon which result in significant energy loss and with its resulting thermal effects in the etalon. For etalons of the design needed for the present invention, photons are typically either reflected once or not reflected at all, which means that the thermal effects on the etalon is reduced very substantially (about one order of magnitude). Therefore, prior art problems associated with thermal effects on etalons used in resonance cavities are substantially reduced or eliminated by the present invention. FIG. 14 shows the reflectivity dependence on wavelength of both the grating and the etalon. Grating reflection has a maximum at a given wavelength $\lambda_0$ which may be selected by tuning mirror 36 in FIG. 7. In the preferred embodiment, one of reflective maxima of the etalon is tuned to be at essentially the same wavelength as the wavelength corresponding to the maximum of the diffraction grating, $\lambda_0$. As a result, dispersion of the diffraction grating adds up with the wavelength selection properties of the etalon resulting in narrower linewidth of the generated light.

Proof of Principal Experiment

Figure 10:
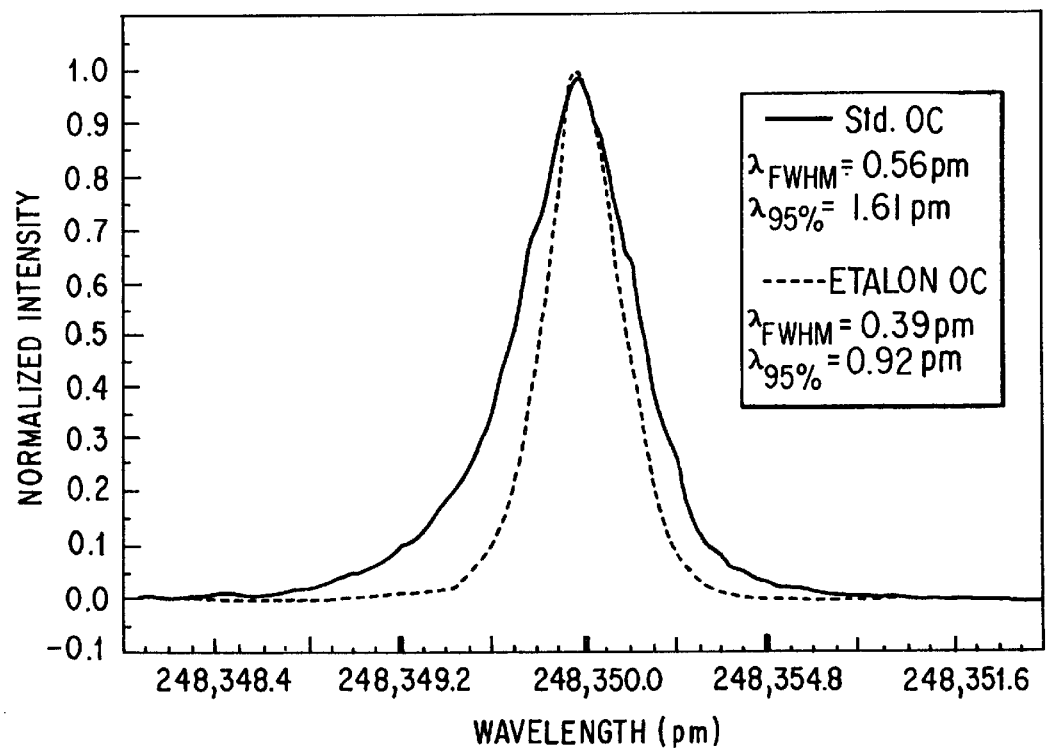
FIG. 10 is test data proving the principles of the present invention.

In order to prove this concept, Applicant performed an experiment replacing the standard output coupler on a commercial laser with a fixed etalon. The optical layout of the laser in this experiment is similar to the standard commercial laser except that an uncoated parallel flat fused silica substrate ⅜" thick was used as an output coupler. This ⅜" plate, referred to as a solid etalon, has similar properties to an air space etalon with an air gap of about 0.56 inches. That substrate works as a reflective etalon with the calculated reflection spectrum shown in FIG. 9. One can see that the maximum reflection is about 15% which is close to the reflection of a typical prior art standard output coupler, i.e., 10% reflection provided by a partially reflecting mirror. To realize the full benefit of an etalon, one of its reflection maxima usually will coincide with the reflection maximum of the grating. This way, dispersion of the diffraction grating is increased by wavelength selective properties of the etalon. FIG. 10 shows the normalized laser output beam spectrum for this situation compared to the best spectrum achievable using the same laser chamber running with a prior art 10% output coupler. This particular prior art spectrum is better than the typical prior art spectrum and provides a 95% integral of 1.61 pm. Typical prior art 95% integrals are about 2 pm to 3 pm. The reduction of the line width can be clearly seen as compared with this very good prior art laser spectrum. The 95% integral is about 0.92 pm. Thus, the desired FWHM bandwidth of less than 0.5 pm and the desired 95% integral bandwidth of less than 2 pm are assured.

The measurements were done using a high resolution spectrometer with a resolution of 0.12 pm. The laser was running on standard fluorine mixture containing approximately 0.1% $F_2$, 1% Kr and the balance of Ne. No reduction in laser efficiency has been observed with the etalon output coupler. The short wavelength tail usually seen on prior art laser spectrum is not present when the etalon is used.

Figure 11:
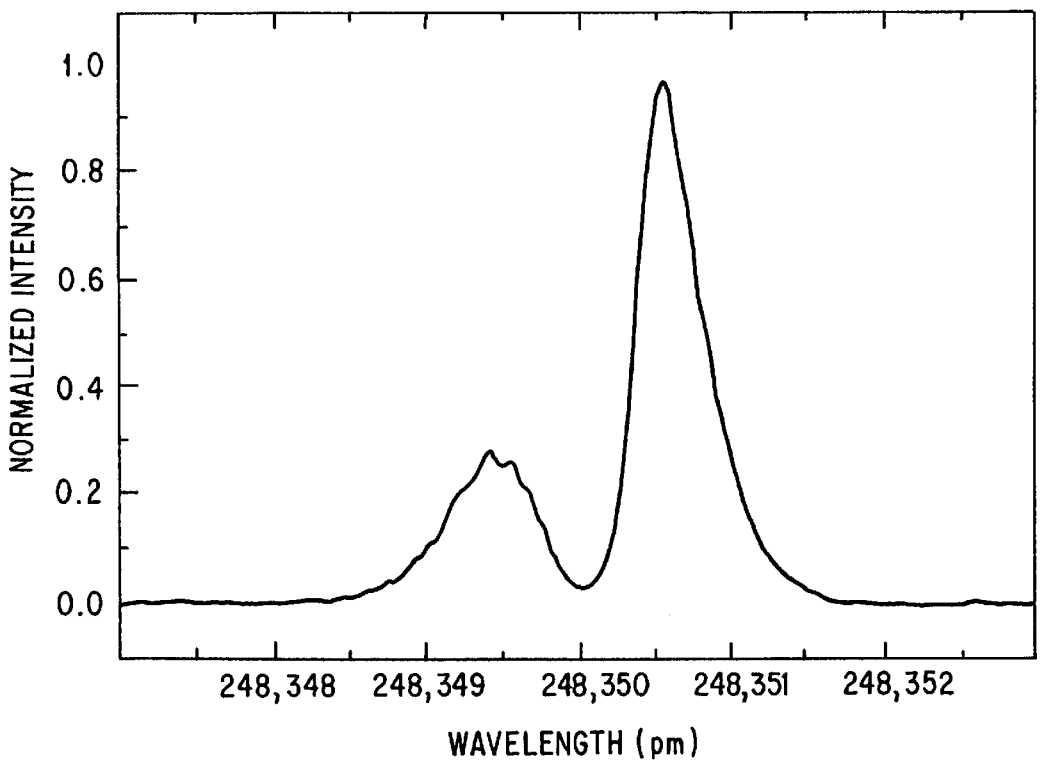
FIGS. 11 and 13 show the effect of slightly mistuning the grating with respect to the etalon.
Figure 13:
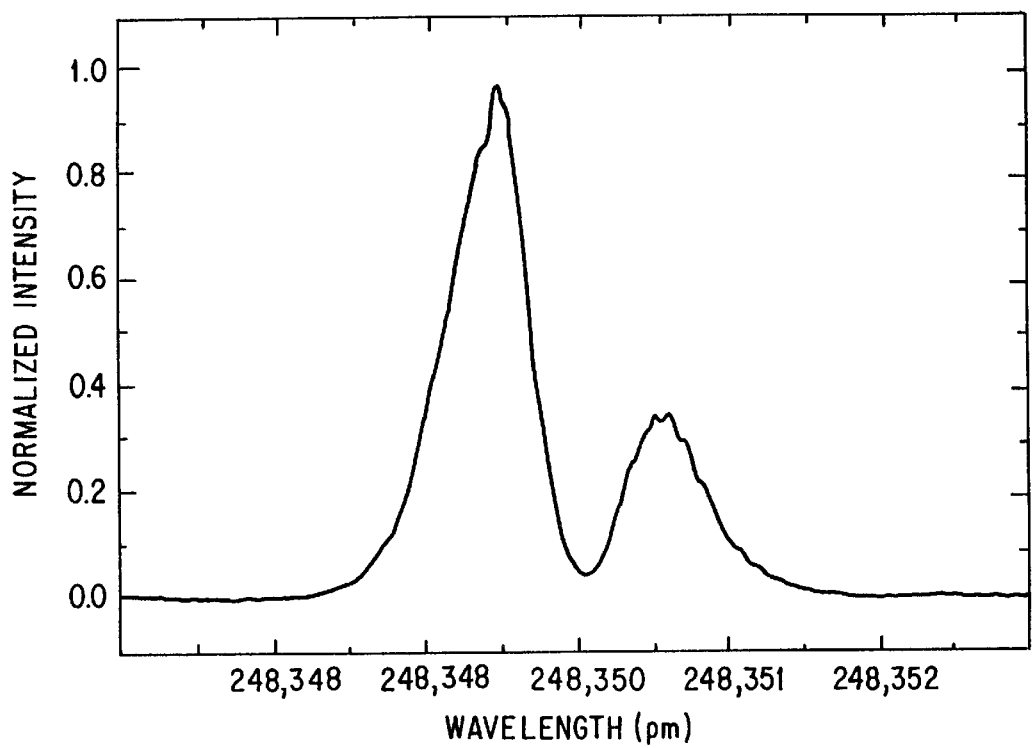
Figure 12:
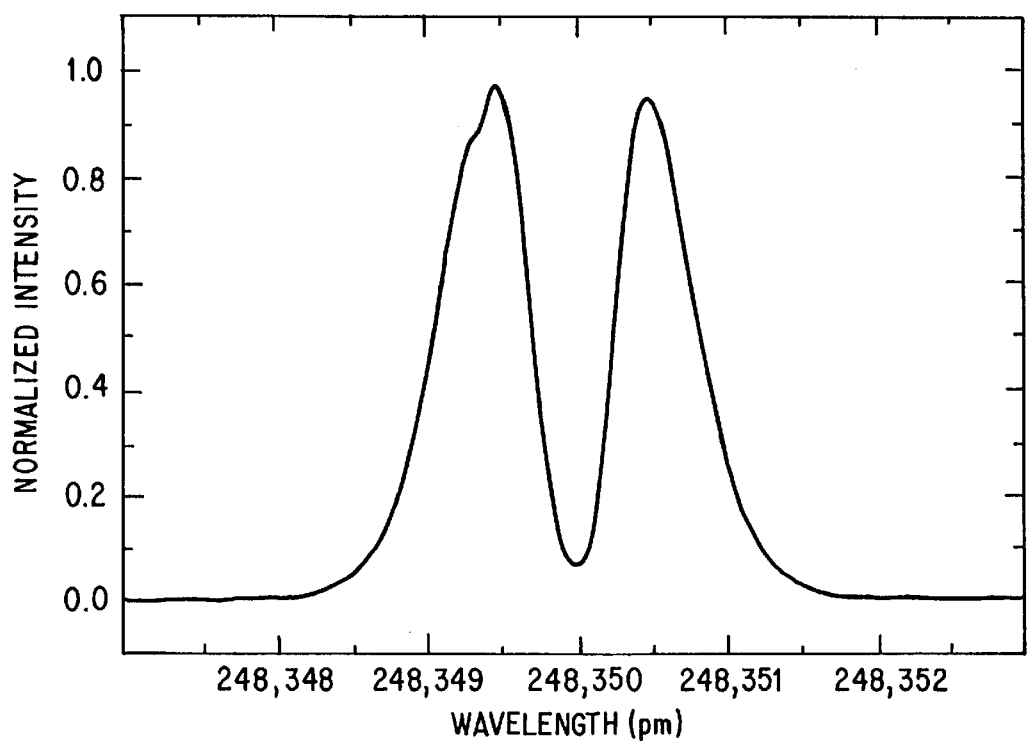
FIG. 12 shows the effect of oppositely tuning the grating with respect to the etalon.

FIGS. 11, 12 and 13 show the laser spectrum when the reflection maxima of the grating and the etalon do not coincide. FIGS. 11 and 13 show the case when etalon is slightly off the maximum of the grating. The spectrum has two asymmetric peaks, and the discharge voltage required to produce given laser pulse energy is increased by 20%.

FIG. 12 shows the case when the etalon is completely mistuned, i.e., the minimum reflection of the etalon coincides with the maximum reflection of diffraction grating. The laser spectrum in this case has two symmetrical peaks, and the discharge voltage is increased by more than 30%.

Preferred Wavelength Control Technique

Thus, as stated above, the preferred control technique for achieving minimum line width is to use computer 22 as shown in FIG. 3 to control both tunable line narrowing module 18 and tunable etalon output coupler 44 based on real time wavelength measurements obtained from wavemeter 20. As indicated above, the narrowest line width of the output beam 50 is provided when the line narrowing module and the output coupler are both tuned to provide maximum reflection at the desired wavelength. Tuning the etalon is done based on results of spectral measurements. Computer 22 generates a correction signal to the tunable etalon 44 (FIG. 3) based on position of the larger peak in the spectrum (FIGS. 11 and 13). Thus, spectrum shown in FIG. 11 means that the etalon gap should be reduced to shift the etalon reflection peak to a slightly shorter wavelength. On the other hand, spectrum which looks like the one shown in FIG. 13 means that the etalon gap should be expanded to shift the etalon reflection peak to a slightly longer wavelength. Tuning the line narrowing module located at the rear of the resonance cavity to provide maximum reflection at the desired wavelength is completely logical; however, having an output coupler tuned to reflect maximum at the desired wavelength and to permit virtually 100 percent transmission at undesired wavelengths may seem contrary to good logic. However, Applicant's demonstrations prove that a very substantial reduction in line width of the output beam can be realized by having an output coupler which provides maximum reflection at the desired wavelength! The arrangement works because reflecting about 15% of the energy at the desired wavelength permits the energy at this wavelength to be further amplified in the laser chamber. About 85% of the energy of the beam at the desired wavelength is transmitted through the etalon. During the early phase of each pulse, 85% to 100% of the energy of the beam at undesirable wavelengths pass out of the chamber through the output coupler, but during this early phase, the total energy in the beam is relatively small so its contribution to the total pulse energy is negligible. During the latter phase of the pulse, the percentage of energy at undesirable wavelengths passing through the output coupler (up to about 100%) is higher than the percentage of energy at the desired wavelength passing through the output coupler (only about 85%). However, since the desired wavelength has been greatly amplified as compared to undesired wavelengths, the result is a beautiful pulse with 95% of the energy concentrated within a band width of less than 1.0 pm.

Further Improvement in Spectral Performance

In addition to the use of the etalon as the output coupler, other modifications can be made to prior art lasers to improve spectral performance.

Reduction of Fluorine Consumption

In preferred embodiments of the present invention which have been built and tested by Applicant and his fellow workers, great care was taken to eliminate materials from the discharge chamber that consume fluorine. Fluorine consumption in a discharge chamber is due to fluorine reaction with materials in the chamber. These reactions typically produce contaminants which result in deterioration of laser performance. In order to minimize fluorine consumption, this preferred embodiment includes the following specific features:

- The chamber walls are aluminum coated with nickel.
- The electrodes are brass.
- All metal O-rings are used as seals.
- Insulators are all ceramic and fluorine compatible.
- Alumina is applicant's preferred insulator material.
- An electrostatic filter is provided as in prior art designs to filter contaminants produced during operation.
- The fan unit is driven using magnetically coupled motors having their stators located outside the sealed discharge chamber using a prior art technique.
- During manufacture, parts are precision cleaned to remove potential contaminants.
- After assembly, the chamber is passivated with fluorine.

Reduction of Nominal Fluorine Concentration

The fluorine concentration is reduced from prior art levels of about 0.1% (3.0 kPa) to about 0.07% (2.1 kPa). The total gas pressure is about 300 kPa. (The Kr concentration is maintained at the prior art level of about 1.3% and the remainder of the laser gas is neon.) During operation, fluorine will be gradually depleted. Constant pulse energy is obtained by gradually increasing the laser operating voltage in accordance with prior art techniques. Injections of a mixture of fluorine and neon are made periodically (typically at intervals of about 1 to 4 hours) to make up for the depletion of fluorine in accordance with techniques well known in the excimer laser prior art. During this procedure, the fluorine concentration is preferably maintained within the range of between about 0.065% and 0.075% and the operating voltage is maintained within a corresponding range appropriate to maintain constant pulse energy. For example, in a preferred embodiment this range was 770 Volts to 790 Volts on a capacitor Co (FIG. 4).

Switch to Calcium Fluoride Prisms

The change in the reflectivity of the output coupler from 10% to 15% had the effect of increasing intensity of the light passing through the line narrowing module. Additional heat generated by this additional illumination can cause thermal distortion in the prisms of the line narrowing module. To solve this potential problem the fused silica prisms could be replaced with calcium fluoride prisms. Calcium fluoride has higher thermal conductivity and can handle the additional energy without unacceptable distortion.

Wavelength and Bandwidth Measurement

The center wavelength of the lithography laser output radiation has to be stabilized in order to: a) maintain focus at the wafer plane, and b) minimize any change in magnification. The wavemeter used for a production lithography laser preferably is compact and yet meets the requirements of good relative accuracy, small long term drift, and a good absolute precision with a reference to an atomic line. Further, the wavelength measurement should be insensitive to changes in the ambient temperature or pressure. In addition, the wavemeter should be capable of measuring the spectral bandwidth (FWHM) with an accuracy of ±0.15 pm. The operating range of this wavemeter can be relatively small, 248.35±0.30 nm.

Figure 8:
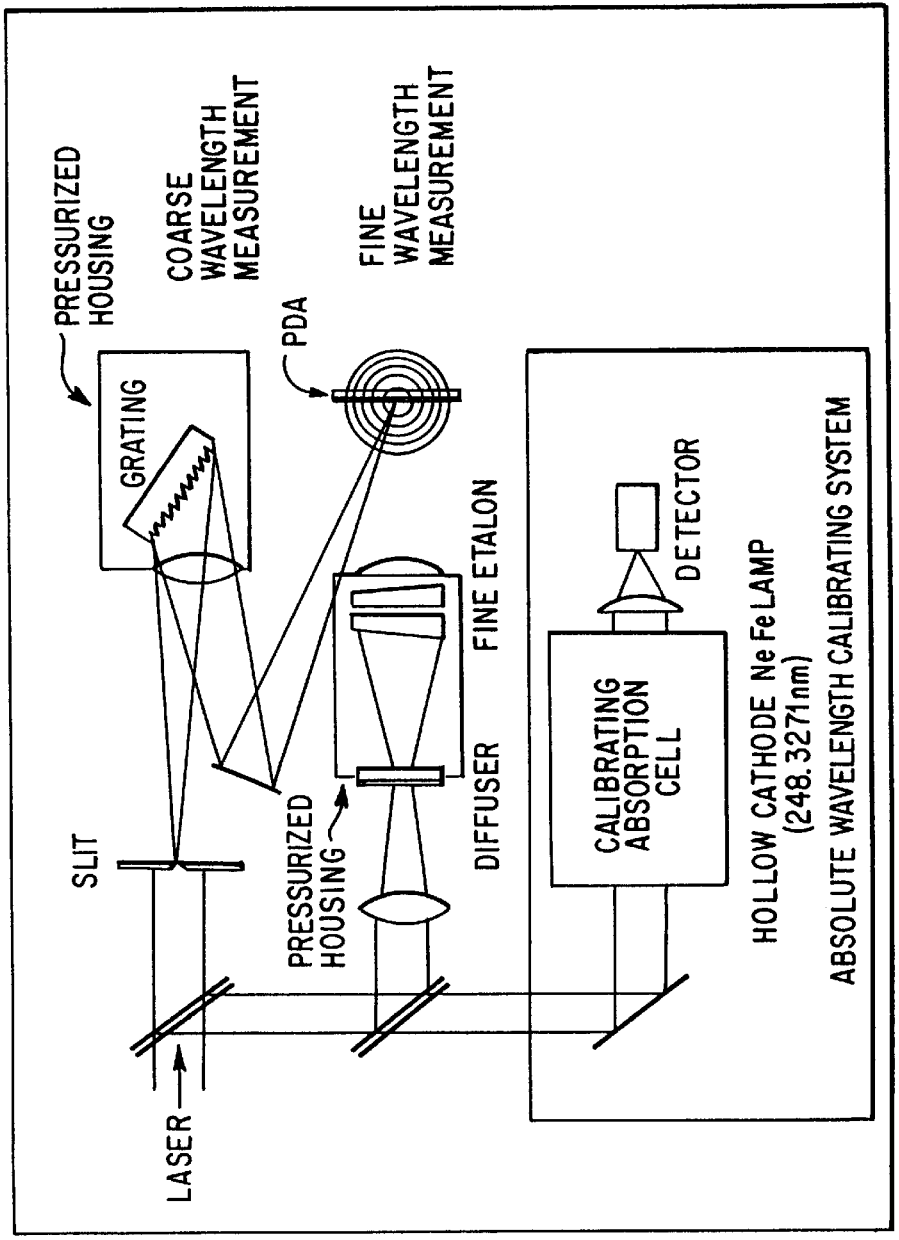
FIG. 8 shows how the wavelength of the laser output beam is measured.

The wavelength is measured using a combination of a grating and an etalon. A schematic layout of this wavemeter is shown in FIG. 8. The grating and the etalons are used respectively for coarse and fine measurements. The output from the grating spectrometer is imaged in the central region of a 1024 element silicon photo diode array, while the fringe pattern from the etalon is imaged on the two sides. The wavelength is determined by measuring the diameter of the etalon fringe pattern and the position of the coarse grating output.

A small change in fringe diameter is proportional to change in the wavelength. For wavelength change less than the free spectral range (FSR) of the etalon, the etalon is capable of tracking the wavelength of the laser. The coarse grating measurement is necessary to eliminate any possible error or discrepancy in the laser wavelength drift of greater than the FSR of the etalon. The preferred etalon has an FSR of 10 pm or less; or another alternative would be to use two etalons, one with an FSR of 20 pm, and the other with an FSR of 5 pm. As is well known, the etalon fringe pattern is identical for wavelengths separated by multiples of its FSR.

The wavemeter is calibrated at the factory with reference to a hollow cathode Ne—Fe lamp which has an absorption peak at 248.3271 nm. Experience has shown that these wave meters can be made stable to within ±0.5 pm. Furthermore, to eliminate ambient pressure dependent changes, both the grating and the etalon are housed inside individual pressurized housings. Temperature stability is achieved by using very low thermal expansion coefficient etalon spacers and good thermal management of the etalon housing.

Finally, the wavelength information obtained from the Wavemeter is used to control laser wavelength by changing the angle of illumination on the grating in the line narrowing module and the spacing between the plates of the etalons in the output coupler. This is done by very slightly pivoting mirror 36 shown in FIG. 7 and/or by very slightly changing the separation of the etalon plates in the output coupler using techniques described above.

Although this very narrow band laser has been described with reference to a particular embodiment, it is to be appreciated that various adaptations and modifications may be made. For example, the techniques described for use on a KrF laser which operates at a nominal wavelength can also be applied to ArF lasers; however, the optics must be designed for 193 nm. In addition, to pressure-tuned etalons and piezoelectric-tuned etalons, there are commercially available etalons which are compression-tuned using mechanical force to widen or narrow the gap between the plates of the etalon. Persons skilled in the art will recognize that the line narrowing module described above could be replaced with many other prior art line narrowing modules, such as modules comprised of a plurality of prisms and a totally reflecting mirror, a diffraction grating without beam expanders, and a diffraction grating and a totally reflecting mirror. Transmissive etalons could also be included in the line narrowing module. Therefore, the invention is only to be limited by the appended claims.

That which is claimed is:

1. A very narrow band excimer laser comprising:
    A. a laser chamber containing:
        (1) two elongated electrodes,
        (2) at least one preionizer, and
        (3) a laser gas,
    B. a line-narrowing unit positioned to accept a portion of the light generated in the laser chamber, narrow its spectrum to produce line-narrowed light, and return it to the laser chamber, said line narrowing unit comprising:
        (1) at least one beam expanding prism,
        (2) a grating, and
        (3) a grating tuning means for tuning the grating;
    C. an output coupler comprising an etalon, said output coupler being positioned to reflect a portion of light generated in said laser chamber and to output a portion of the light;
wherein both the grating and the etalon are arranged to provide at least approximately maximum reflection into the chamber at a single desired wavelength.

2. An excimer laser as in claim 1 and further comprising a wavemeter and a wavelength controller for controlling the grating tuning means.

3. An excimer laser as in claim 2 and further comprising an etalon tuning means.

4. An excimer laser as in claim 1 wherein both the grating and the etalon are arranged to provide maximum reflection at a single very narrow range of desired wavelength.

5. An excimer laser as in claim 1 wherein said laser gas is comprised of fluorine and either krypton or argon, and said laser chamber is comprised of materials which are fluorine compatible.

6. An excimer laser in claim 1 wherein said output coupler is tunable and further comprising a etalon tuning means.

7. An excimer laser as in claim 1 wherein said line narrowing unit comprises at least one prism and a totally reflecting mirror.

8. An excimer laser as in claim 1 wherein said etalon is a pressure-tuned etalon.

9. An excimer laser as in claim 1 wherein said etalon is a piezoelectric-tuned etalon.

10. An excimer laser as in claim 1 wherein said etalon is a compression-tuned etalon.

11. An excimer laser as in claim 1 wherein said etalon defines two internal parallel surfaces, both of which are free of any coating.

12. A very narrow band KrF excimer laser comprising:
    A. a laser chamber comprised of fluorine compatible materials and containing:
        (1) two elongated electrodes,
        (2) at least one preionizer, and
        (3) laser gas defining a total pressure and comprised of krypton, fluorine and a buffer gas, said fluorine having a partial pressure of less than 0.08 of the total pressure;
    B. a tunable line narrowing unit comprised of:
        (1) at least one beam expanding prism, and
        (2) a tunable grating;
    C. an output coupler comprising an etalon;
wherein both the grating and the etalon are arranged to provide at least approximately maximum reflection into the chamber at a single desired wavelength.

13. A very narrow band excimer laser as in claim 12 wherein said output coupler is a tunable output coupler.

14. A KrF excimer laser as in claim 13 and further comprising a wavemeter for measuring wavelength of said output laser beam.

15. A KrF laser a in claim 14 and further comprising a controller for tuning the line narrowing module and the output coupler.

* * * * *